(12) United States Patent
Duchaigne

(10) Patent No.: US 12,429,394 B2
(45) Date of Patent: Sep. 30, 2025

(54) METHOD FOR LOCATING AN AIR LEAK IN A NETWORK FOR SUPPLYING PRESSURIZED AIR, ASSOCIATED COMPUTER PROGRAM PRODUCT AND SYSTEM

(71) Applicant: LIEBHERR-AEROSPACE TOULOUSE SAS, Toulouse (FR)

(72) Inventor: Claire Duchaigne, Toulouse (FR)

(73) Assignee: LIEBHERR-AEROSPACE TOULOUSE SAS, Toulouse (FR)

( * ) Notice: Subject to any disclaimer, the term of this patent is extended or adjusted under 35 U.S.C. 154(b) by 270 days.

(21) Appl. No.: 18/228,639

(22) Filed: Jul. 31, 2023

(65) Prior Publication Data

US 2024/0035916 A1    Feb. 1, 2024

(51) Int. Cl.
*G01M 3/04* (2006.01)
*G06F 30/18* (2020.01)

(52) U.S. Cl.
CPC ............. *G01M 3/045* (2013.01); *G06F 30/18* (2020.01)

(58) Field of Classification Search
CPC .............................. G01M 3/045; G06F 30/18
See application file for complete search history.

(56) References Cited

U.S. PATENT DOCUMENTS

| | | | | |
|---|---|---|---|---|
| 5,294,909 A * | 3/1994 | Frazier | ............... | G01M 3/165 374/114 |
| 7,133,800 B2 * | 11/2006 | Delin | ............... | H04J 3/0641 370/464 |
| 8,708,554 B2 * | 4/2014 | Thompson | ............ | G01M 3/045 374/45 |
| 8,955,383 B2 * | 2/2015 | Huseynov | ............... | G01M 3/24 73/592 |
| 9,933,327 B2 * | 4/2018 | Faqihi | ............... | G01M 3/025 |
| 9,995,647 B2 * | 6/2018 | Huseynov | ............... | G01M 3/24 |
| 10,101,218 B2 * | 10/2018 | Ding | ............... | G01K 13/00 |
| 11,190,918 B1 * | 11/2021 | Lingle | ............... | H02J 50/001 |
| 11,428,582 B2 * | 8/2022 | Merat | ............... | G01K 3/005 |
| 11,879,787 B2 * | 1/2024 | Varnell | ............... | G01K 13/024 |
| 2005/0000295 A1 * | 1/2005 | Lohmeier | ............... | G01L 19/147 73/727 |

(Continued)

FOREIGN PATENT DOCUMENTS

CN       202111293303 A   *   2/2022
JP         2015007509 A         1/2015

*Primary Examiner* — Steven Lim
*Assistant Examiner* — Son M Tang
(74) *Attorney, Agent, or Firm* — CRGO Global; Steven M. Greenberg

(57) ABSTRACT

Described herein is the location of an air leak in a network for supplying pressurized air that includes one or more components and at least one leak detection loop including one or more sensing elements. The location includes receiving information representative of detection of the leak by a sensing element of the detection loop, receiving a 3D model of at least part of the network for supplying pressurized air, interrogating a database associating a leak site of a component with each location on the detection loop, determining a precise location of the leak on the network for supplying pressurized air, mapping the precise location relative to a component, and instructing display of the 3D model corresponding to the component of the supply network and of the precise location.

6 Claims, 3 Drawing Sheets

(56) References Cited

U.S. PATENT DOCUMENTS

| | | | |
|---|---|---|---|
| 2008/0192118 A1* | 8/2008 | Rimbold | H04N 23/661 348/159 |
| 2013/0237811 A1* | 9/2013 | Mihailescu | G01S 17/66 600/407 |
| 2014/0121558 A1* | 5/2014 | Alonsoperez Lanza | G16H 40/67 600/549 |
| 2016/0148417 A1* | 5/2016 | Kim | G06F 3/14 345/419 |
| 2016/0335875 A1* | 11/2016 | Alcorn | G01F 1/68 |
| 2017/0089800 A1* | 3/2017 | Huseynov | G01S 5/20 |
| 2017/0307465 A1* | 10/2017 | Yokono | G08B 21/20 |
| 2018/0018502 A1* | 1/2018 | Rao | H04B 10/1143 |
| 2019/0156079 A1* | 5/2019 | Espinosa | G08C 17/02 |
| 2019/0195722 A1* | 6/2019 | Liu | G01M 3/2807 |
| 2020/0267941 A1* | 8/2020 | Seltzer | A01K 27/009 |
| 2020/0284139 A1* | 9/2020 | Kyle | E21B 47/053 |
| 2020/0292406 A1* | 9/2020 | Son | G01M 3/24 |
| 2020/0364937 A1* | 11/2020 | Selbrede | G06T 19/20 |
| 2021/0327084 A1* | 10/2021 | Ivanov | G06V 20/588 |
| 2021/0405638 A1* | 12/2021 | Boyraz | G06V 20/64 |
| 2022/0057224 A1* | 2/2022 | Nemirovsky | G01C 21/3647 |
| 2023/0334298 A1* | 10/2023 | Deleuze | G06N 3/047 |

* cited by examiner

[Fig. 1]
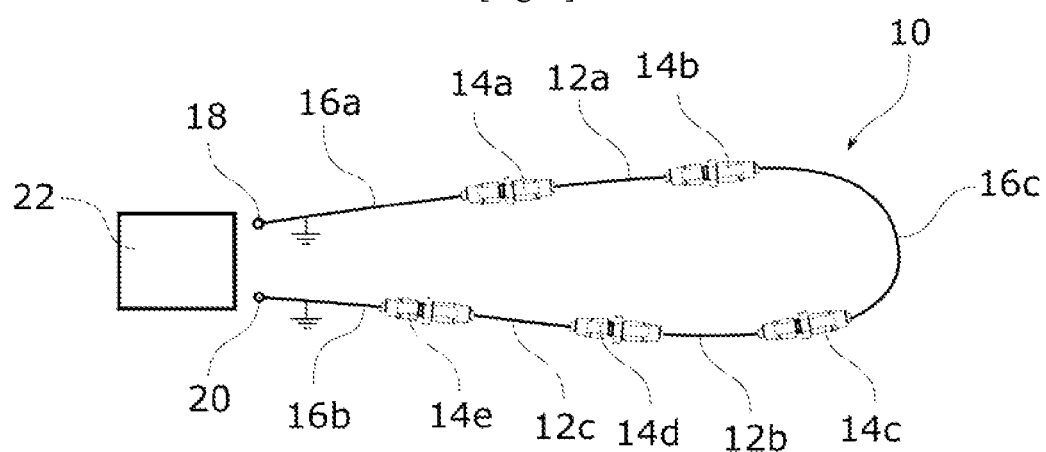
[Fig. 2]
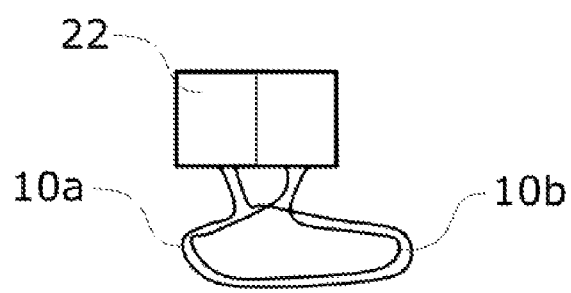

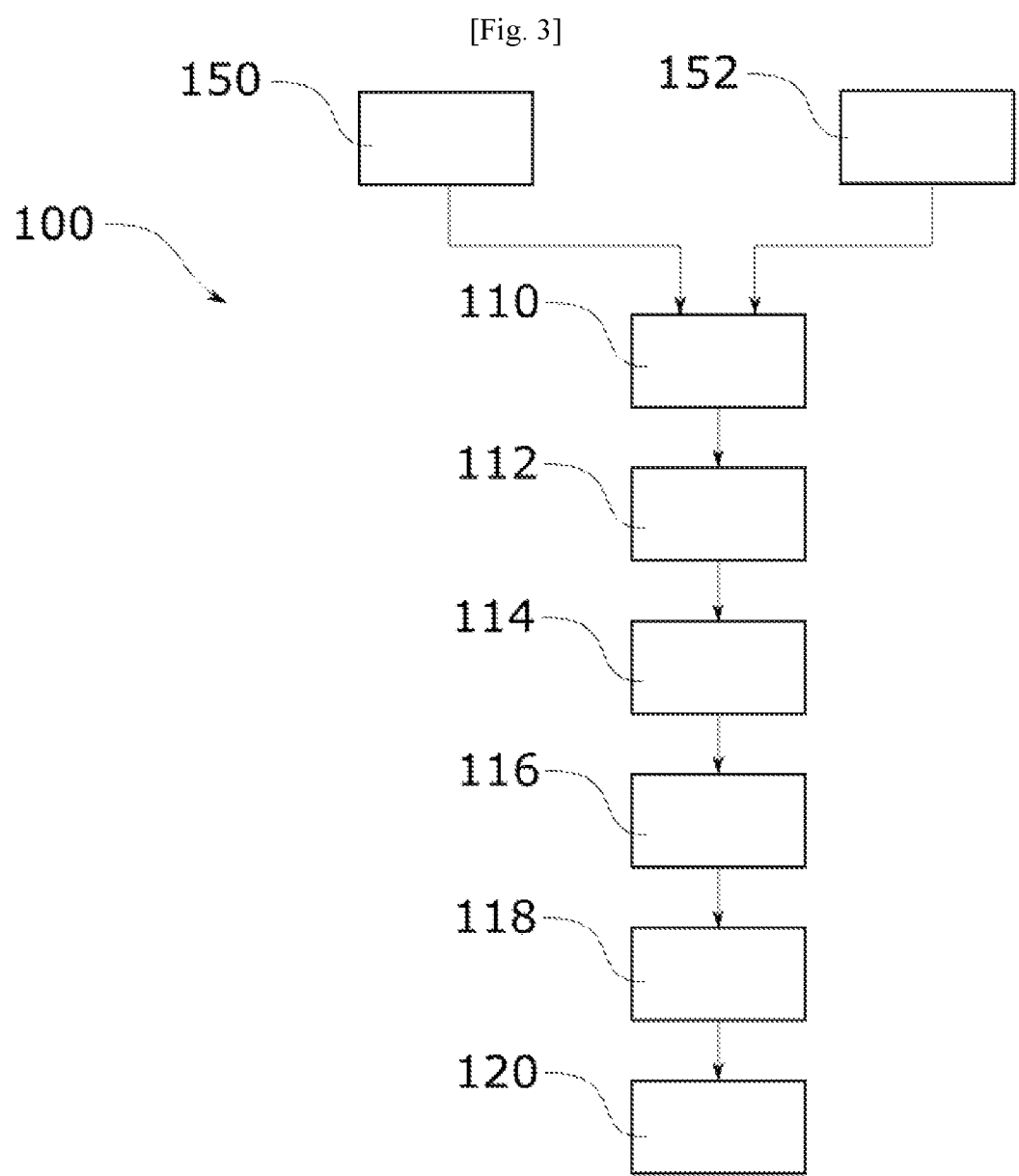
[Fig. 3]

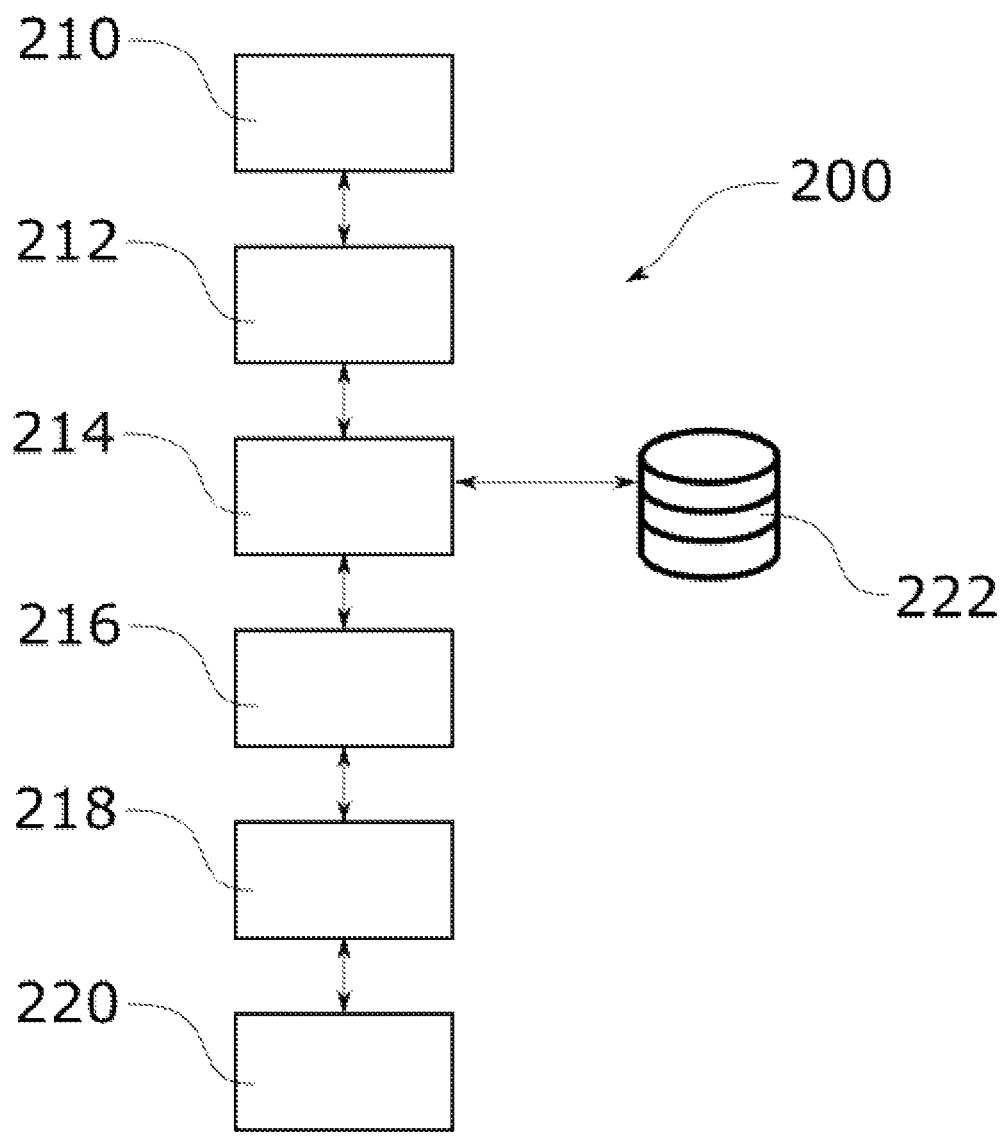
[Fig. 4]

METHOD FOR LOCATING AN AIR LEAK IN A NETWORK FOR SUPPLYING PRESSURIZED AIR, ASSOCIATED COMPUTER PROGRAM PRODUCT AND SYSTEM

CROSS REFERENCE TO RELATED APPLICATIONS

This application claims priority under 35 U.S.C. § 119(a) to France patent application 2207984 filed on Aug. 1, 2022, the entire teachings of which are incorporated herein by reference.

BACKGROUND OF THE INVENTION

Field of the Invention

The invention relates to a method for locating an air leak in a network for supplying pressurized air. In particular, the invention relates to a method making it possible to associate an approximate location of an air leak detected by a detection loop with a precise location able to be related to a 3D model of the supply network.

Description of the Related Art

Networks for supplying pressurized air can be installed in particular in vehicles, in particular aeronautical or rail vehicles, in order to supply the different systems and devices requiring pressurized air in order to function.

In an aircraft, the pressurized air is in particular drawn from the engine air (this air generally being referred to as bleed air) or generated by a dedicated compressor (in bleedless-type architectures), and is used e.g. to supply the air-conditioning system, for the anti-ice systems, the powering of actuators, the starting or restarting of propulsion engines, etc.

Networks for supplying pressurized air are thus critical elements which must be monitored, in particular for the detection of leaks which can e.g. damage the equipment close to the leak owing to the heat of the pressurized air, and/or reduce the efficiency of the supply of pressurized air. This monitoring is effected in particular by a bleed leak detection system which includes, on the one hand, an isolating protection means aiming to contain the leak and orifices disposed on this protection means and aiming to direct the leak towards a sensing element making it possible to detect the leak. The sensing element forms part of an assembly of sensing elements connected in series in a leak detection loop, connected to a controller making it possible to interpret the signals generated by the sensing elements of the loop and to signal an alert of the detection of a leak.

Currently, the alert given by the controller is used by a human operator who must refer to technical documentation in paper format in order to link the content of the alert to the equipment where the leak is. In particular, plans of the detection loop make it possible to visually find the position of the sensing element corresponding to the information provided by the alert, and the position of the sensing element must be found visually on a plan or other visual model of the supply network in the technical documentation in paper format. Furthermore, the technical documentation in paper format is general and not solely dedicated to the search for a leak, which makes it more difficult to consult and obscures the precision of the information enabling the leak to be detected.

BRIEF SUMMARY OF THE INVENTION

The inventors have thus sought a solution making it possible to automate the detection of the location of the leak in order to simplify the maintenance of the aircraft.

The invention aims to provide a method for locating a leak and a computer program product for locating a leak in a network for supplying pressurized air.

In particular, the invention aims to provide, in at least one embodiment, a method for locating a leak in a network for supplying pressurized air including at least one loop for detecting a leak, equipped with sensing elements, in particular in an aircraft.

The invention also aims to provide, in at least one embodiment of the invention, a locating method making it possible to assist an operator in detecting, locating and maintaining or repairing a leak of a component of a network for supplying pressurized air.

The invention also aims to provide, in at least one embodiment of the invention, a locating method making it possible to assist an operator in detecting, locating and repairing a leak of a network for supplying pressurized air.

In order to do this, the invention relates to a method for locating a leak of air in a network for supplying pressurized air including a plurality of components and at least one leak detection loop including a plurality of sensing elements, including:
  a step of receiving information representative of detection of the leak by a sensing element of the detection loop, the information including a reference to the sensing element having detected the leak and a location on the detection loop,
  a step of receiving a 3D model of at least part of the network for supplying pressurized air,
  a step of interrogating a database associating a leak site of a component of the supply network with each location on the detection loop,
  a step of determining, from the information representative of detection and from the database, a precise location of the leak on the network for supplying pressurized air,
  a step of mapping the precise location relative to a component of the supply network, and
  a step of instructing display of the 3D model corresponding to the component of the supply network and of the precise location.

A method in accordance with the invention thus makes it possible to simplify the search for a leak by an operator by virtue of the automated determination of a precise location of the leak on a 3D model of the network for supplying pressurized air. Locating is facilitated in particular as compared with the prior art where the operator must manually refer to technical documentation in paper format which is exhaustive but generally not dedicated solely to the search for a leak. The locating method is dedicated to the search for a leak and makes it possible to reduce the search time while increasing the precision with which the leak is located by virtue of the pre-filled database and the pre-generated 3D model.

Displaying the precise location on a 3D model makes it possible to simplify the search for the leak for the operator, in particular by making possible the manipulation of the model (zoom, rotation, translation, full or partial view, etc.) in order to tag the arrangement of the component concerned in preparation for maintenance or repair.

Receiving the information representative of detection of the leak by a sensing element of the detection loop can be manual (e.g. inputting of the information from the controller by a human operator into a graphical interface) or automatic (e.g. direct transmission of the information by a controller).

Displaying the 3D model with the precise location can include additional information on the maintenance or repair of the fault, e.g. a repair history, instructions for accessing the component to be repaired, repair work, etc.

For reasons of redundancy and reliability, the supply network generally includes two detection loops, managed by the same controller. The method makes it possible to distinguish the location of the fault depending on the detection loop or loops having detected the leak.

Advantageously and in accordance with the invention, the method includes a preliminary step of creating the database associating a leak site of a component of the supply network with each location on the detection loop.

Advantageously and in accordance with the invention, the method includes a preliminary step of modeling the 3D model, the 3D model including 3D models of components of the supply network and of the detection loop.

According to these aspects of the invention, the creation of the database and/or the creation of the 3D model are effected e.g. using existing data such as the existing technical documentation and/or existing 3D models and are adapted to the particular application of the detection of a leak in the network for supplying pressurized air.

Advantageously and in accordance with the invention, the preliminary step of modeling the 3D model includes the modeling of collars configured for attaching the detection loop to the supply network.

According to this aspect of the invention, the modeling of the collars for attaching the detection loop makes it possible to add information facilitating the tagging of the location of the leak by the operator during his repair or maintenance work.

Advantageously and in accordance with the invention, the database includes the association between the location on the detection loop and each attachment collar of the supply network modeled in the 3D model.

According to this aspect of the invention, the addition of the attachment collars in the database makes it possible to increase the precision during the determination of the precise location depending on the components of the supply network.

The invention also relates to a computer program product for locating an air leak in a network for supplying pressurized air including a plurality of components and at least one leak detection loop including a plurality of sensing elements, the computer program product including program code instructions in order to execute, when the computer program product is executed on a computer, the following steps:
  a step of receiving information representative of detection of the leak by a sensing element of the detection loop, the information including a reference to the sensing element having detected the leak and a location on the detection loop,
  a step of receiving a 3D model of at least part of the network for supplying pressurized air,
  a step of interrogating a database associating a leak site of a component of the supply network with each location on the detection loop,
  a step of determining, from the information representative of detection and from the database, a precise location of the leak on the network for supplying pressurized air,
  a step of mapping the precise location relative to a component of the supply network,
  a step of instructing display of the 3D model corresponding to the component of the supply network and of the precise location.

The computer program product can be executed by an external computing device used by the maintenance or repair operators, in particular an external mobile device such as an external laptop, or by an internal computing device such as a controller of the aircraft or of the vehicle including the network for supplying pressurized air. The external computing device can also be e.g. a tablet or telephone, the computer program product taking the form of an application installed on the tablet or telephone.

Advantageously and in accordance with the invention, the computer program product for locating a leak in accordance with the invention includes program code instructions for executing, when the computer program product is executed on a computer, the steps of the method for locating a leak in accordance with the invention.

Advantageously and in accordance with the invention, the method for locating a leak in accordance with the invention is configured to be implemented by a computer program product for locating a leak in accordance with the invention.

The invention also relates to a system for locating a leak of air in a network for supplying pressurized air including a plurality of components and at least one leak detection loop including a plurality of sensing elements, including:
  a module for receiving information representative of detection of the leak by a sensing element of the detection loop, the information including a reference to the sensing element having detected the leak and a location on the detection loop,
  a module for receiving a 3D model of at least part of the network for supplying pressurized air,
  a module for interrogating a database associating a leak site of a component of the supply network with each location on the detection loop,
  a module for determining, from the information representative of detection and from the database, a precise location of the leak on the network for supplying pressurized air,
  a module for mapping the precise location relative to a component of the supply network,
  a module for instructing display of the 3D model corresponding to the component of the supply network and of the precise location.

A module can e.g. consist of a computing device such as a computer, a group of computing devices, an electronic component or a group of electronic components, or e.g. a computer program, a group of computer programs, a library of a computer program or a computer program function executed by a computing device such as a computer, a group of computing devices, an electronic component or a group of electronic components.

Advantageously and in accordance with the invention, the system for locating a leak in accordance with the invention is configured to implement a method for locating a leak in accordance with the invention.

Advantageously and in accordance with the invention, the method for locating a leak in accordance with the invention is configured to be implemented by a system in accordance with the invention.

The invention also relates to a method for locating a leak, a computer program product for locating a leak and a system for locating a leak which are characterized in combination by all or some of the features mentioned above or below.

Additional aspects of the invention will be set forth in part in the description which follows, and in part will be obvious from the description, or may be learned by practice of the invention. The aspects of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The accompanying drawings, which are incorporated in and constitute part of this specification, illustrate embodiments of the invention and together with the description, serve to explain the principles of the invention. The embodiments illustrated herein are presently preferred, it being understood, however, that the invention is not limited to the precise arrangements and instrumentalities shown, wherein:

FIG. 1 is a schematic view of a leak detection loop of a network for supplying pressurized air.

FIG. 2 is a schematic view of a group of leak detection loops including two leak detection loops.

FIG. 3 is a schematic view of a method for locating a leak in accordance with one embodiment of the invention.

FIG. 4 is a schematic view of a system for locating a leak in accordance with one embodiment of the invention.

DETAILED DESCRIPTION OF THE INVENTION

In the figures, for the purposes of illustration and clarity, scales and proportions have not been strictly respected.

Furthermore, identical, similar or analogous elements are designated by the same reference signs in all the figures.

FIG. 1 schematically illustrates a leak detection loop 10 in a network for supplying pressurized air. The loop includes a plurality of sensing elements 12a, 12b, 12c and connection wires 16a, 16b, 16c connected to each other by connectors 14a, 14b, 14c, 14d, 14e. The sensing elements 12a, 12b, 12c make it possible to detect leaks, while the connection wires 16a, 16b, 16c make it possible to transmit electrical energy through the loop as a whole. The sensing elements 12a, 12b, 12c are formed e.g. of conductive elements, one part of which melts upon detection of a leak, which causes the formation of a contact point in the sensing element and thus the passage of electricity.

The loop is also defined by a loop start point 18 and a loop end point 20, the points being connected to a controller 22 of the vehicle, making possible the supply of power and the interpretation of the changes of state of the loop, in particular when a leak is detected at a sensing element. In an aircraft, the controller 22 is e.g. the anti-ice and leak-detection controller, AILC.

The detection of a leak by a sensing element is detected by the controller 22 which interprets the information received and releases it, generally in the form of information representative of detection of the leak by a sensing element. In this embodiment, this information can include e.g. the specifying of the sensing element having detected the leak as well as a value expressing linearly, expressed as a percentage, the location of the leak on the detection loop with respect to the loop start and end points, 0% expressing a leak at loop start point 18, 100% expressing a leak at loop end point 20, 50% expressing a leak at a point on the loop equidistant from the loop start and end points. In the prior art technical documentation in paper format, percentage intervals are associated with each sensing element, e.g. and solely by way of illustration, 30% to 40% for a first sensing element 12a, 55% to 65% for a second sensing element 12b and 65% to 75% for a third sensing element 12c.

FIG. 2 schematically illustrates a group of two leak detection loops, a first leak detection loop 10a and a second leak detection loop 10b, the two loops being connected to the controller 22 and following the same path so as to provide redundancy and reliability to the leak detection, in particular in order to ensure leak detection and to reduce the number of false detections of a leak.

FIG. 3 schematically illustrates a method 100 for locating a leak in accordance with the invention.

The invention makes it possible to locate a leak of air in a network for supplying pressurized air including a plurality of components and at least one leak detection loop including a plurality of sensing elements.

The method 100 for locating a leak includes in particular a step 110 of receiving information representative of detection of the leak by a sensing element of the detection loop, the information including a reference to the sensing element having detected the leak and a location on the detection loop. In this embodiment, as described above, the information includes the sensing element having detected the leak and a percentage indicating the location of the leak on the detection loop with respect to the loop start and end points.

When the method is implemented by a computer program product, the computer program product can either receive the information representative of detection of the leak directly from the controller 22, or require the information representative of detection of the leak to be supplied manually by a maintenance or repair operator in the computer program product via a graphical interface.

The method 100 for locating a leak also includes a step 112 of receiving a 3D model of at least part of the network for supplying pressurized air. The 3D model is prepared e.g. during a preliminary step 150 of modeling the 3D model, the 3D model including 3D models of components of the supply network and of the detection loop.

The method 100 for locating a leak then includes a step 114 of interrogating a database associating a leak site of a component of the supply network with each location on the detection loop, and a step 116 of determining, from the information representative of detection and from the database, a precise location of the leak on the network for supplying pressurized air.

In this embodiment, the database makes in particular the link between a precise location of the leak and the sensing element having detected the leak as well as the percentage representing the location. These steps make it possible to pass from a location uniquely linked to the sensing element and the loop to a location linked to the supply network itself where the leak is present, while taking account of the exact percentage supplied representing the location. In particular, the percentage makes it possible to know exactly the location of the leak on the leak detection loop, whereas the prior art provides only percentage intervals for each sensing element. These steps replace the need for an operator to refer to the technical documentation in paper format on the one hand in order to find the information associating each sensing element with a percentage interval, and on the other hand in order to find the information associating this location in the loop with a precise location in the supply network, based on an approximate mental estimation made by the operator based on the percentage provided. For example, for the detection loop of FIG. 1, a percentage of 62% associated with the second sensing element 12b cannot be precisely located in the paper documentation, but can be associated with a precise location in the locating method 100 of the invention by virtue of the database.

The database can be prepared during a preliminary step 152 of creating the database associating a leak site of a component of the supply network with each location on the detection loop.

The method 100 for locating a leak also includes a step 118 of mapping the precise location relative to a component of the supply network, making it possible to identify the component of the supply network which has a leak.

The method 100 for locating a leak finally includes a step 120 of instructing display of the 3D model corresponding to the component of the supply network and of the precise location. The maintenance or repair operator can thus know which component requires work and thus prepare for this work based on the precise location and the component concerned. Furthermore, the operator can enable direct identification of the work site, which speeds up and simplifies the repair or maintenance.

Displaying can consist of displaying a light spot, constant or flashing, on an overall or partial view of the supply network, representing the precise location. The display can also include 3D navigation options such as translation, rotation or zoom on the 3D model, and the presence of editable text relating to the component of the supply network, to instructions making possible the repair or maintenance, to a history of the component, to comments by operators who have previously worked on the component or on other neighboring components of the supply network etc.

The display can also be configured according to the operator's requirements.

In one embodiment of the invention, the preliminary step 150 of modeling the 3D model includes in particular the modeling of collars configured for attaching the detection loop to the supply network. Furthermore, the database includes the association between the location on the detection loop and each attachment collar of the supply network modeled in the 3D model. Access to this additional information makes it possible to facilitate the locating of the leak by the operator.

FIG. 4 schematically illustrates a system 200 for locating a leak according to one embodiment of the invention, making it possible to implement all or some of the steps of the locating method described above.

The system includes in particular:
a module 210 for receiving information representative of detection of the leak by a sensing element of the detection loop, the information including a reference to the sensing element having detected the leak and a location on the detection loop,
a module 212 for receiving a 3D model of at least part of the network for supplying pressurized air,
a module 214 for interrogating a database 222 associating a leak site of a component of the supply network with each location on the detection loop,
a module 216 for determining, from the information representative of detection and from the database 222, a precise location of the leak on the network for supplying pressurized air,
a module 218 for mapping the precise location relative to a component of the supply network,
a module 220 for instructing display of the 3D model corresponding to the component of the supply network and of the precise location.

The invention is not limited to the embodiments described. In particular, the method for locating a leak can be implemented by a computer program product loaded e.g. into a controller of the aircraft including the network for supplying pressurized air, or in an external computing device used by the maintenance or repair operators. Of note, the terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", and/or "including," when used in this specification, specify the presence of stated features, integers, steps, operations, elements, and/or components, but do not preclude the presence or addition of one or more other features, integers, steps, operations, elements, components, and/or groups thereof.

As well, the corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to embodiments thereof, it will be apparent that modifications and variations are possible without departing from the scope of the invention defined in the appended claims as follows:

The invention claimed is:

1. A method for locating an air leak in a network for supplying pressurized air comprising a plurality of components and at least one leak detection loop comprising a plurality of sensing elements, comprising:
receiving information representative of detection of the leak by a sensing clement of said detection loop, said information comprising a reference to the sensing element having detected the leak and a location on the detection loop,
receiving a 3D model of at least part of the network for supplying pressurized air,
interrogating a database associating a leak site of a component of the supply network with each location on the detection loop,
determining, from said information representative of detection and from said database, a precise location of said leak on the network for supplying pressurized air,
mapping said precise location relative to a component of the supply network, and
instructing display of the 3D model corresponding to said component of the supply network and of said precise location;
modeling the 3D model, said 3D model comprising 3D models of components of the supply network and of the detection loop.

2. The method of claim 1, further comprising a preliminary step of creating the database associating a leak site of a component of the supply network with each location on the detection loop.

3. The method of claim 1, wherein the preliminary step of modeling the 3D model comprises the modeling of collars configured for attaching the detection loop to the supply network.

4. The method of claim 1, wherein the database comprises the association between the location on the detection loop and each attachment collar of the supply network modeled in the 3D model.

5. A non-transitory computer program product for locating an air leak in a network for supplying pressurized air comprising a plurality of components and at least one leak detection loop comprising a plurality of sensing elements, said computer program product comprising program code instructions in order to execute, when said computer program product is executed on a computer, the following steps:
   receiving information representative of detection of the leak by a sensing element of said detection loop, said information comprising a reference to the sensing element having detected the leak and a location on the detection loop,
   receiving a 3D model of at least part of the network for supplying pressurized air,
   interrogating a database associating a leak site of a component of the supply network with each location on the detection loop,
   determining, from said information representative of detection and from said database, a precise location of said leak on the network for supplying pressurized air,
   mapping said precise location relative to a component of the supply network, and, instructing display of the 3D model corresponding to said component of the supply network and of said precise location; and
   the 3D model comprising 3D models of components of the supply network and of the detection loop.

6. A system for locating an air leak in a network for supplying pressurized air comprising a plurality of components and at least one leak detection loop comprising a plurality of sensing elements, comprising:
   a module for receiving information representative of detection of the leak by a sensing element of said detection loop, said information comprising a reference to the sensing element having detected the leak and a location on the detection loop,
   a module for receiving a 3D model of at least part of the network for supplying pressurized air,
   a module for interrogating a database associating a leak site of a component of the supply network with each location on the detection loop,
   a module for determining, from said information representative of detection and from said database, a precise location of said leak on the network for supplying pressurized air,
   a module for mapping said precise location relative to a component of the supply network,
   a module for instructing display of the 3D model corresponding to said component of the supply network and of said precise location; and
   the 3D model comprising 3D models of components of the supply network and of the detection loop.

* * * * *